(12) United States Patent
van Haaster et al.

(10) Patent No.: US 7,135,643 B2
(45) Date of Patent: Nov. 14, 2006

(54) EMI SHIELD INCLUDING A LOSSY MEDIUM

(75) Inventors: Philip van Haaster, Corona, CA (US); Edward Nakauchi, Westminster, CA (US); Richard Norman Johnson, Encinitas, CA (US)

(73) Assignee: Laird Technologies, Inc., Delaware Water Gap, PA (US)

( * ) Notice: Subject to any disclaimer, the term of this patent is extended or adjusted under 35 U.S.C. 154(b) by 0 days.

(21) Appl. No.: 10/319,797

(22) Filed: Dec. 13, 2002

(65) Prior Publication Data

US 2004/0001299 A1    Jan. 1, 2004

Related U.S. Application Data

(60) Provisional application No. 60/340,343, filed on Dec. 14, 2001.

(51) Int. Cl.
    *H05K 9/00* (2006.01)
(52) U.S. Cl. .................. 174/382; 174/377; 174/391; 428/323; 361/816
(58) Field of Classification Search .............. 174/35 R, 174/35 MS, 35 GC, 377, 391; 361/816, 361/818, 782, 799, 800; 482/255, 256, 338, 482/339, 692, 928, 323; 428/255, 256, 338, 428/339, 692, 728, 323; 385/92
    See application file for complete search history.

(56) References Cited

U.S. PATENT DOCUMENTS

| | | | |
|---|---|---|---|
| 4,408,255 A | | 10/1983 | Adkins |
| 5,170,009 A | * | 12/1992 | Kadokura .................. 174/35 R |
| 5,428,506 A | | 6/1995 | Brown et al. |
| 5,539,148 A | * | 7/1996 | Konishi et al. ........... 174/35 R |
| 5,617,095 A | | 4/1997 | Kim et al. |
| 5,639,989 A | | 6/1997 | Higgins, III |
| 5,689,275 A | | 11/1997 | Moore et al. |
| 5,841,067 A | * | 11/1998 | Nakamura et al. ...... 174/35 MS |
| 5,864,088 A | * | 1/1999 | Sato et al. ............. 174/35 MS |
| 5,938,979 A | * | 8/1999 | Kambe et al. .............. 252/500 |
| 6,243,274 B1 | * | 6/2001 | Willis ......................... 361/816 |
| 6,416,830 B1 | * | 7/2002 | Yoshida et al. ............ 428/34.5 |
| 6,455,771 B1 | * | 9/2002 | Han et al. .............. 174/35 MS |

(Continued)

FOREIGN PATENT DOCUMENTS

EP    0 588 574 A1    3/1994

(Continued)

OTHER PUBLICATIONS

"Cooperation Agreement for Small Form-Factor Pluggable Transceivers," Sep. 14, 2000.

(Continued)

*Primary Examiner*—Hung V. Ngo
(74) *Attorney, Agent, or Firm*—Harness, Dickey & Pierce, P.L.C.

(57) ABSTRACT

Lossy materials can be used to suppress EMI transmission. Disclosed are methods for applying lossy materials to EMI shielded enclosures to improve EMI shielding effectiveness and the EMI shielded enclosures so produced. In some embodiments, the EMI shielded enclosure includes a printed-circuit board mountable device. In one embodiment, lossy material can be applied to the interior of an EMI shielded enclosure using an adhesive. In another embodiment, lossy materials can be applied to the exterior of the EMI enclosure to suppress EMI incident upon the EMI shielded enclosure, thereby reducing the susceptibility of electronics contained within the EMI shielded enclosure. In yet another embodiment, lossy materials can be applied to both the interior and exterior of the EMI enclosure.

49 Claims, 13 Drawing Sheets

U.S. PATENT DOCUMENTS

| | | | |
|---|---|---|---|
| 6,545,212 B1 * | 4/2003 | Uchida et al. | 174/35 R |
| 6,607,308 B1 * | 8/2003 | Dair et al. | 385/92 |
| 2002/0029893 A1 | 3/2002 | Toyoda et al. | |

FOREIGN PATENT DOCUMENTS

| | | |
|---|---|---|
| EP | 588 574 | 3/1994 |
| EP | 1 143 780 A1 | 10/2001 |
| EP | 1 146 591 | 10/2001 |
| EP | 1 146 591 A2 | 10/2001 |
| JP | 11-307974 | 5/1999 |
| JP | 11-307974 | 11/1999 |
| WO | WO 01/52362 A1 | 7/2001 |

OTHER PUBLICATIONS

Underwriter Laboratories Standard 94, "Tests for Flammability of Plastic Materials for Parts in Devices and Appliances," 5$^{th}$ Edition, 1996.

International Search Report PCT/US 02/40044 dated Nov. 11, 2004.

* cited by examiner

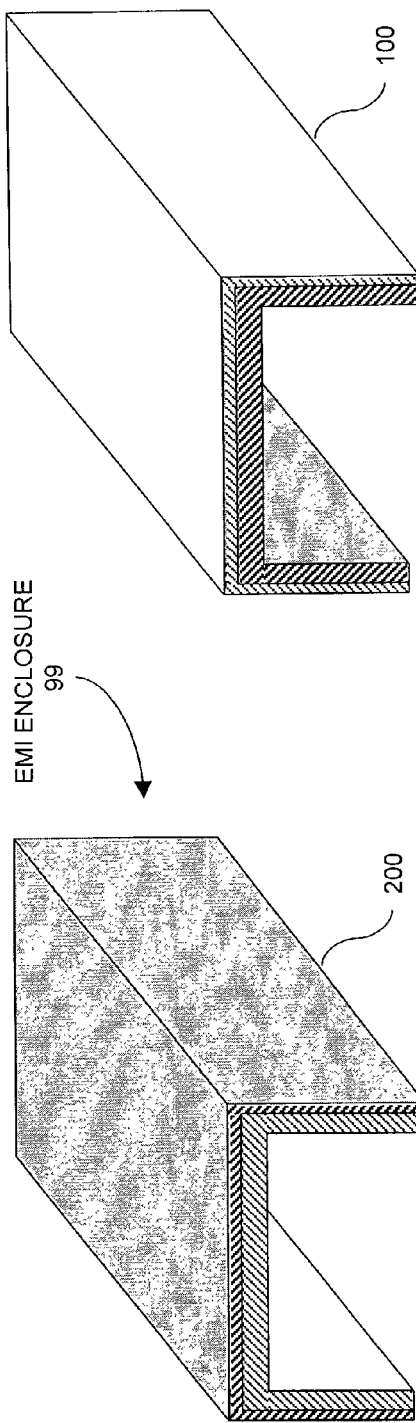
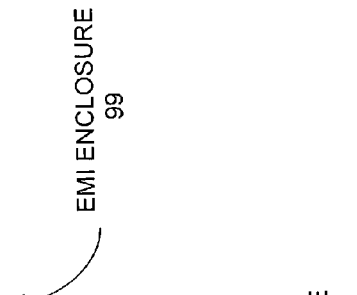
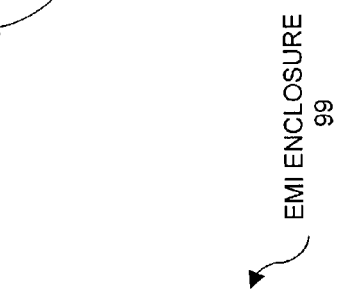
FIG. 4A
FIG. 4B
FIG. 4C

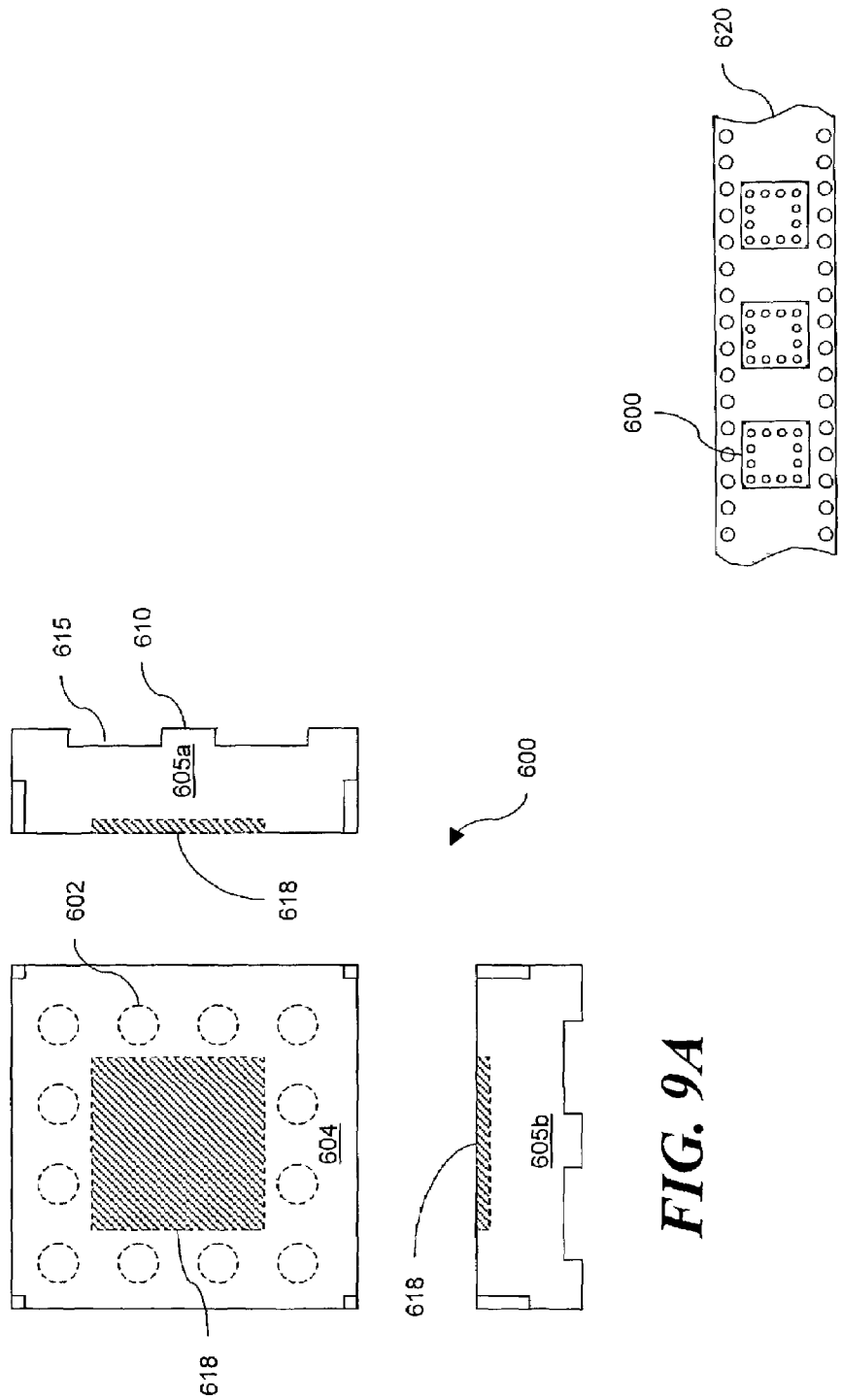

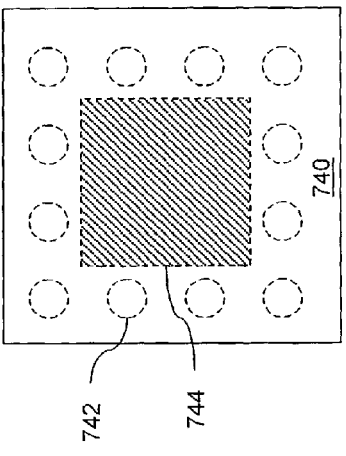
FIG. 10B
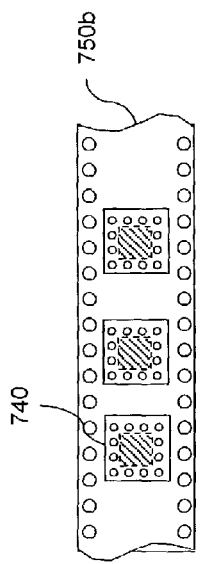
FIG. 10D
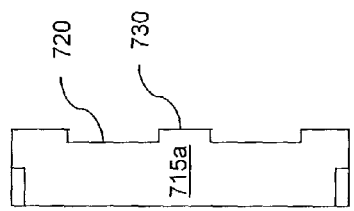
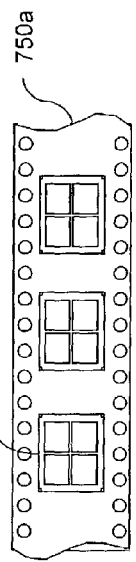
FIG. 10C
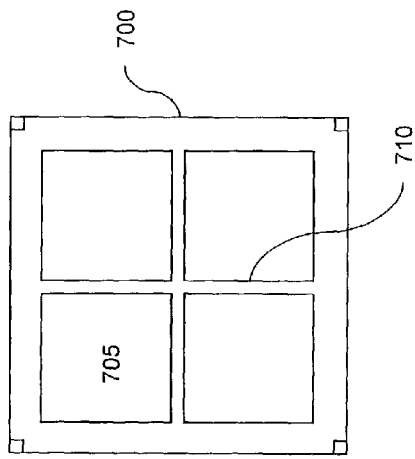
FIG. 10A

EMI SHIELD INCLUDING A LOSSY MEDIUM

CROSS-REFERENCE TO RELATED APPLICATION

This application claims the benefit of and priority to U.S. Provisional Application Ser. No. 60/340,343, filed on Dec. 14, 2001, the disclosure of which is incorporated herein by reference in its entirety.

FIELD OF THE INVENTION

The present invention relates to generally to electronic component packaging and, more specifically, to electronic component packages that are shielded to protect against electromagnetic interference (EMI).

BACKGROUND OF THE INVENTION

As used herein, the term EMI should be considered to refer generally to both electromagnetic interference and radio frequency interference (RFI) emissions, and the term "electromagnetic" should be considered to refer generally to electromagnetic and radio frequency.

During normal operation, electronic equipment typically generates undesirable electromagnetic energy that can interfere with the operation of proximately located electronic equipment due to EMI transmission by radiation and conduction. The electromagnetic energy can be of a wide range of wavelengths and frequencies. To minimize the problems associated with EMI, sources of undesirable electromagnetic energy may be shielded and electrically grounded. Alternatively, or additionally, susceptors of EMI may be similarly shielded and electrically grounded. Shielding is designed to prevent both ingress and egress of electromagnetic energy relative to a housing or other enclosure in which the electronic equipment is disposed. Since such enclosures often include gaps or seams between adjacent access panels and around doors, effective shielding is difficult to attain, because the gaps in the enclosure permit transference of EMI therethrough. Further, in the case of electrically conductive metal enclosures, these gaps can inhibit the beneficial Faraday Cage Effect by forming discontinuities in the conductivity of the enclosure which compromise the efficiency of the ground conduction path through the enclosure. Moreover, by presenting an electrical conductivity level at the gaps that is significantly different from that of the enclosure generally, the gaps can act as slot antennae, resulting in the enclosure itself becoming a secondary source of EMI.

Shields are generally constructed to reduce EMI at a particular wavelength, or range of wavelengths. EMI shields are typically constructed of a highly-conductive material operating to reflect the radiation component of the EMI and to drain to electrical ground the conducted component of the EMI. For example, EMI shields are typically constructed of a metal, such as copper, aluminum, gold, tin, steel, and stainless steel, sheet metal and nickel. EMI shields may also be constructed of combinations of different metals, such as nickel-coated copper, and combinations of a conductive material with an electrical insulator, such as metal-plated plastic. In the abstract, an ideal EMI shield would consist of a completely enclosed housing constructed of an infinitely-conductive material without any apertures, seams, gaps, or vents. Practical applications, however, result in an enclosure constructed of a finitely-conducting material and having some apertures. Generally, reducing the largest dimension (not merely the total area) of any aperture, as well as reducing the total number of apertures, tends to increase the EMI protection or shielding effectiveness of the enclosure. Apertures may be intentional, such as those accommodating air flow for cooling, or unintentional, such as those incident to a method of construction (e.g., seams). Special methods of manufacture may be employed to improve shielding effectiveness by welding or soldering seams, or by milling a cavity. The shielding effectiveness of an EMI enclosure having an aperture is a function of the wavelength of the EMI. Generally, the shielding effectiveness is improved when the largest dimension of the aperture is small compared to the wavelength (i.e., less than one-half the wavelength). As the frequencies of operation increase, however, the associated wavelengths of induced EMI decrease, leading to a reduction in shielding effectiveness for any non-ideal EMI enclosure.

EMI shielded enclosures are typically constructed of conductive materials that induce resonances of the electromagnetic energy within the cavity. For example, reflections of the electromagnetic field at the boundaries of the cavity can create standing waves within the cavity under certain conditions. Such resonances tend to increase the peak amplitudes of the electromagnetic energy through additive effects of the multiple reflections. These resonance effects, by increasing the peak energy levels within the enclosure, can reduce the apparent shielding effectiveness at the resonant frequencies because the same enclosure is shielding a larger source of EMI—the resonant peak electromagnetic energy.

EMI protection is particularly important in small, densely packaged, sensitive electronic applications operating at high frequencies. In one application, a communications transceiver, such as a Gigabit Interface Converter (GBIC), converts electrical currents into optical signals suitable for transmission over a fiber-optic cable and optical signals into electrical currents. GBICS are typically employed in fiber-optic telecommunications and networking systems as an interface for high-speed networking. As the name suggests, the data rates of transmission are greater than one gigabit-per-second (Gbps). In some applications GBIC modules are installed within an EMI enclosure. One particular form factor for an EMI cage 50, or housing, shown in FIGS. 1A and 1B is described in a Multi-source Agreement (MSA) prepared by several cooperating members within the related industry. As shown in FIG. 1, one end 55 of the housing 50 is opened to accommodate the insertion and extraction of a GBIC transceiver (i.e., a transceiver having a form factor compliant with the Small-Form-Factor-Pluggable specifications described in the "Cooperation Agreement for Small Form-Factor Pluggable Transceivers," dated Sep. 14, 2000, the contents of which are herein incorporated by reference in their entirety). The MSA-recommended EMI cage 50 offers a design level of shielding effectiveness for GBIC operations at 1 Gbps; however, as operating frequencies increase, the shielding effectiveness of the recommended EMI cage, without modification, will be inadequate. For example, emerging applications using the optical carrier protocols described in the Synchronous Optical Network (SONET) standards can operate above 1 Gbps (e.g., the OC-48 protocol supporting data rates of up to 2.5 Gbps and OC-192 protocol supporting data rates of up to 10 Gbps).

There exist certain methods for providing EMI shielding to electronic components. For example, U.S. Pat. No. 5,639,989 issued to Higgins, III, the disclosure of which is herein incorporated by reference in its entirety. Higgins discloses the use of a housing wherein all interior surfaces are conformally coated with a first EMI material consisting of a polymer containing filler particles. The method disclosed in Higgins applies the first EMI material as a conformal coating. The disclosed method also indicates that selection of different materials for filler particles results in the attenuation of electromagnetic energy within specified frequency ranges.

SUMMARY OF INVENTION

In general, the present invention relates to an EMI shield, such as a highly-conductive metal enclosure or cage, that incorporates an electrically absorbing or lossy material to absorb a portion of the EMI, thereby enhancing the performance of the EMI shield over a range of operational frequencies. The absorbing material may remove a portion of the EMI from the environment by the process of ohmic loss—dissipating a portion of the EMI in the form of thermal heating. The absorbing material, when placed within a conductive cavity may also alter the resonant characteristics of the cavity to reduce resonant "peaks" of the electromagnetic fields within the cavity, and/or to translate in frequency, a resonant peak or cutoff.

In one aspect, the invention relates to a shielding system for providing shielding from high-frequency, electromagnetic interference. The shielding system includes an electrically-conductive shield adapted for covering at least a portion of a device. The shielding system also includes an electromagnetic absorbing material disposed on a first side of the electrically-conductive shield. The combined electrically-conductive shield and electromagnetic absorbing material attenuate a transfer of electromagnetic energy with respect to the shielded device.

In one embodiment, the shielding system includes an enclosure defining a cavity suitable for housing a device, such as a board mounted device. In another embodiment, the housing is adapted for enclosing the device on substantially all sides. In yet another embodiment, the electromagnetic absorbing material is applied to at least a portion of an interior surface.

In one embodiment, the housing is adapted for attachment to a circuit board. In another embodiment, the housing includes at least one portion being removably attached. In another embodiment, the electrically-conductive shield is adapted for housing at least one of a fiber optic transmitter and a fiber optic receiver. In another embodiment, the electrically-conductive shield is adapted for housing a gigabit interface converter (GBIC). In yet another embodiment, the electrically-conductive shield includes a form factor substantially compliant with a small-form-factor-pluggable standard.

In one embodiment, the electrically-conductive shield is selected from the group consisting of aluminum, copper, nickel, tin, silver, gold, beryllium, phosphor bronze, steel, stainless steel, and combinations thereof. In another embodiment, the electrically-conductive shield includes sheet metal.

In one embodiment, the energy absorptive material is selected from the group consisting of electrically conductive material, carbonyl iron powder, sendust, ferrite, iron silicide, magnetic alloys, magnetic flakes, and combinations thereof. In another embodiment, the energy absorptive material includes electrically absorbing particles suspended in a matrix. In another embodiment, the energy absorptive material is selected from the group consisting of electrically conductive material, carbon, carbonyl iron powder, sendust, ferrites, iron silicide, magnetic alloys, magnetic flakes, steel wool, carbon-impregnated rubber, ferrite in a plastic stranded carrier, metal foils, metal clad materials including iron, nickel, and iron/nickel compositions, paste composites selected from the group consisting of iron, nickel, copper with epoxy, lacquer binders, and combinations thereof, and combinations thereof. In yet another embodiment, energy absorptive material is attached using a pressure sensitive adhesive.

In another aspect, the invention relates to a process for attenuating a transfer of high-frequency electromagnetic energy with respect to a device. The process includes the steps of reflecting electromagnetic energy at an electrically-conductive shield adapted for covering at least a portion of a device, altering an electromagnetic resonance associated with the electrically-conductive shield, and absorbing a portion of electromagnetic energy proximate to the electrically-conductive shield. The shield thereby reduces a transfer of electromagnetic energy with respect to the device. In one embodiment, the step of altering the electromagnetic resonance includes reducing a peak amplitude of the electromagnetic resonance.

In another aspect, the invention relates to a process for attenuating a transfer of high-frequency electromagnetic energy with respect to a device. The process includes the steps of providing an electrically-conductive shield adapted for covering at least a portion of a device, and providing an electromagnetic absorbing material adapted for absorbing at least a portion of electromagnetic energy within a predetermined range of wavelengths. The process also includes the steps of treating at least a portion of the electrically-conductive shield with electromagnetic absorbing material and placing the treated electrically-conductive shield in the immediate vicinity of the device. The electrically-conductive shield reduces a transfer of electromagnetic energy with respect to the device.

In one embodiment, the step of treating includes applying the electromagnetic absorbing material to a first side of the electrically-conductive shield. In another embodiment, the step of treating is selected from the group including painting, dipping, spraying, vapor depositing, silk screening, mechanically fastening, chemically bonding, and combinations thereof. In another embodiment, the step of treating includes at least one of molding, forming, and forming in place the electromagnetic absorbing material onto the electrically-conductive shield.

In one embodiment, the step of providing an electromagnetic absorbing material includes forming a sheet of absorbing material having a predetermined thickness, and adapting the sheet of absorbing material for application to a first side of the electrically conductive shield. In another embodiment, the adapting step includes applying a chemical fastener to at least one side of the sheet of absorbing material. In yet another embodiment, the adapting step includes applying a pressure sensitive adhesive to at least one side of the sheet of absorbing material.

In yet another aspect, the invention relates to a shield for attenuating a transfer of high-frequency electromagnetic energy with respect to a device, the shield including means for reflecting electromagnetic energy adapted for covering at least a portion of the device, means for altering an electromagnetic resonance response associated with the means for reflecting electromagnetic energy, and means for absorbing a portion of electromagnetic energy proximate to the means for reflecting electromagnetic energy. The shield thereby reduces a transfer of electromagnetic energy with respect to the device. In one embodiment, the means for reflecting electromagnetic energy includes an electrically-conductive shield. In another embodiment, the means for altering an electromagnetic resonance includes an electromagnetic absorbing material.

BRIEF DESCRIPTION OF THE DRAWINGS

The invention is pointed out with particularity in the appended claims. The advantages of the invention may be better understood by referring to the following description, taken in conjunction with the accompanying drawings, in which:

FIG. 4A is a schematic drawing of another alternative embodiment of the invention, in which a lossy material is applied to the outside portion of an EMI enclosure;

FIG. 4B is a schematic drawing of yet another alternative embodiment of the invention, in which a lossy material is applied to the inside portion of an EMI enclosure;

FIG. 4C is a schematic drawing of still another alternative embodiment of the invention, in which a lossy material is applied to both the inside and the outside of an EMI enclosure;

FIG. 9A is a schematic drawing of a circuit board mountable embodiment of the invention;

FIG. 9B is a schematic drawing of a tape and reel packaging configuration of the embodiment illustrated in FIG. 9A;

FIGS. 10A and 10B are schematic drawings of a two-piece circuit board mountable embodiment of the invention; and FIGS. 10C and 10D are schematic drawing of a tape and reel packaging configuration of the embodiment illustrated in FIGS. 10A and 10B, respectively.

DETAILED DESCRIPTION OF THE INVENTION

Figure 1A:
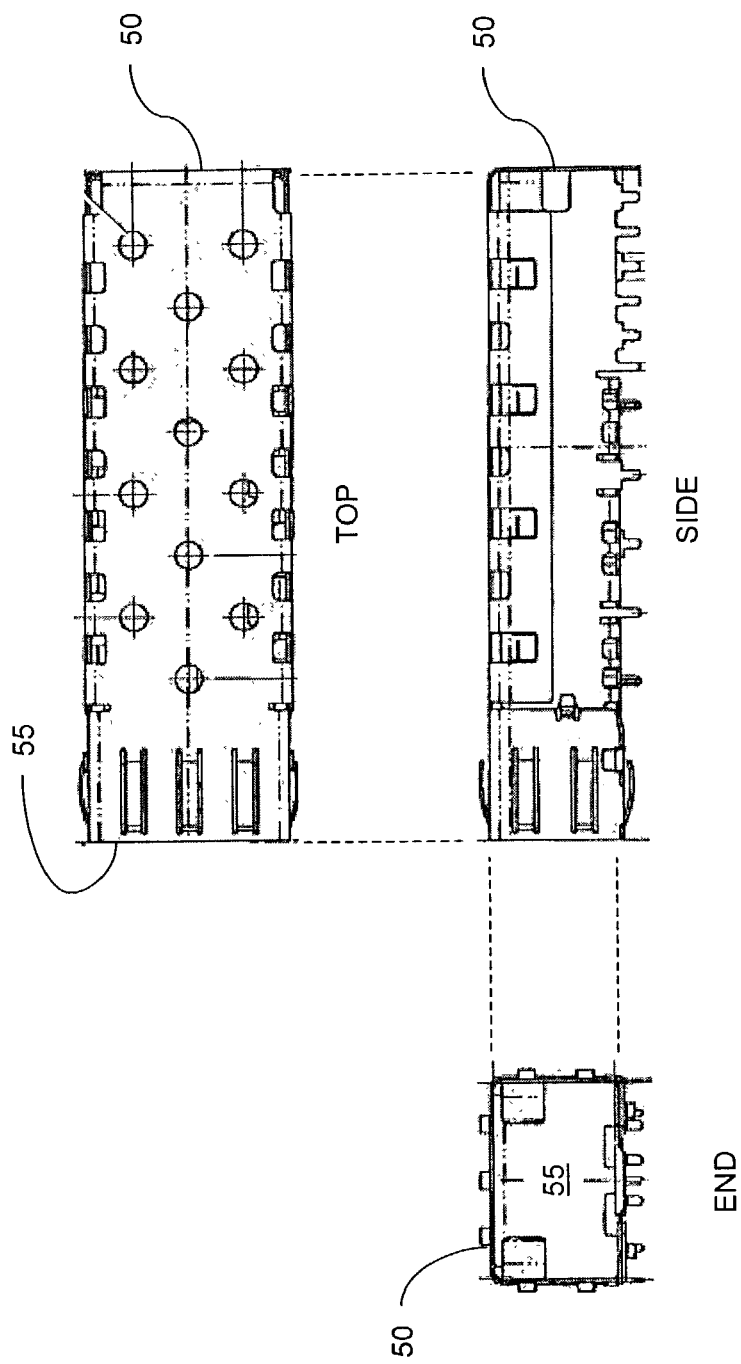
FIG. 1A is a schematic drawings depicting external orthogonal views of a top, side, and end of an electrically-conducting EMI cage for a device.

Lossy materials can be used to suppress EMI transmissions, for example, by converting the electromagnetic energy into another form of energy, such as thermal energy. The electromagnetic fields can induce electrical currents to flow within the lossy material having a finite electrical conductivity, resulting in ohmic losses. In one embodiment, the lossy material can be composed of ferrite-like material mixed in an elastomer, such as a resin binder. In other embodiments, the lossy material can be composed of a lossy filler material, such as carbon powder mixed in an open-celled reticulated foam. The lossy materials can be configured in sheet form or in a liquid form for coating a substrate. Some examples of lossy materials are electrically conductive material, carbon, iron, carbonyl iron powder, sendust, ferrites, iron silicide, magnetic alloys, magnetic flakes, steel wool, and combinations thereof. Other examples of lossy materials include carbon-impregnated rubber, ferrite in a plastic stranded carrier, metal foils, metal clad materials including iron, nickel, and iron/nickel compositions, paste composites selected from the group consisting of iron, nickel, copper with epoxy, lacquer binders, and combinations thereof, and in combination with the previous exemplary lossy materials. Other materials used to achieve electromagnetic effects include alumina ($Al_2O_3$), sapphire, silica ($SiO_2$), titanium oxide ($TiO_2$), and combinations thereof.

In some embodiments, the lossy material can be combined with other materials to achieve a desired effect. For example, the lossy material can be combined with a fire retardant to meet stringent flammability standards. One such flammability standard is the UL94V0 vertical flame test, described in detail in Underwriter Laboratories Standard 94, entitled "Tests for Flammability of Plastic Materials for Parts in Devices and Appliances," $5^{th}$ Edition, 1996, the disclosure of which is incorporated herein by reference in its entirety. In one embodiment, flame retardant additive is prepared in a particulate form and combined with a lossy material, such as carbonyl iron powder whereby each additive is suspended in a matrix, such as an elastomer, or resin binder.

Various U.S. patents describe lossy materials and their uses. See, for example, U.S. Pat. No. 4,408,255 issued to Adkins, U.S. Pat. No. 5,689,275 issued to Moore et al., U.S. Pat. No. 5,617,095 issued to Kim et al., and U.S. Pat. No. 5,428,506 issued to Brown et al., the disclosures of which are herein incorporated by reference in their entirety. Co-pending U.S. provisional patent application Ser. No. 60/419,873, filed on Oct. 21, 2002, the disclosure of which is incorporated herein by reference in its entirety, also describes lossy materials. Some manufactures of lossy materials are R&F Products of San Marcos, Calif.; ARC Technical Resources, Inc. of San Jose, Calif.; Tokin America, Inc. of Union City, Calif.; Intermark-USA, Inc. of Long Island City, N.Y.; TDK of Mount Prospect, Ill.; Emerson & Cuming Composite Materials, Inc., of Canton, Mass.; Cuming Corp. Microwave Products, of Avon, Mass.; and Capcon of Inwood, N.Y.

According to the present invention, EMI shielding can be added to newly fabricated or existing packages, or housings, for electronic components by applying a first, high-frequency, absorbing EMI material to a second, reflecting EMI material. The high frequency absorbing material includes a lossy material. In some embodiments that lossy material is broad band in nature, absorbing EMI energy over a broad range of frequencies. The reflecting EMI material can be any of the EMI shielding materials, such as metals, including sheet metals currently used by those skilled in the art.

In one embodiment, the lossy material can be fabricated in a sheet and applied to at least a portion of a conductive EMI shield, such as a metallic EMI shield. Alternatively, the lossy material can be applied as a sheet, or coating, during the course of manufacture. The lossy materials can be added to the interior, the exterior, or both the interior and exterior surfaces of the EMI shield.

Figure 2A:
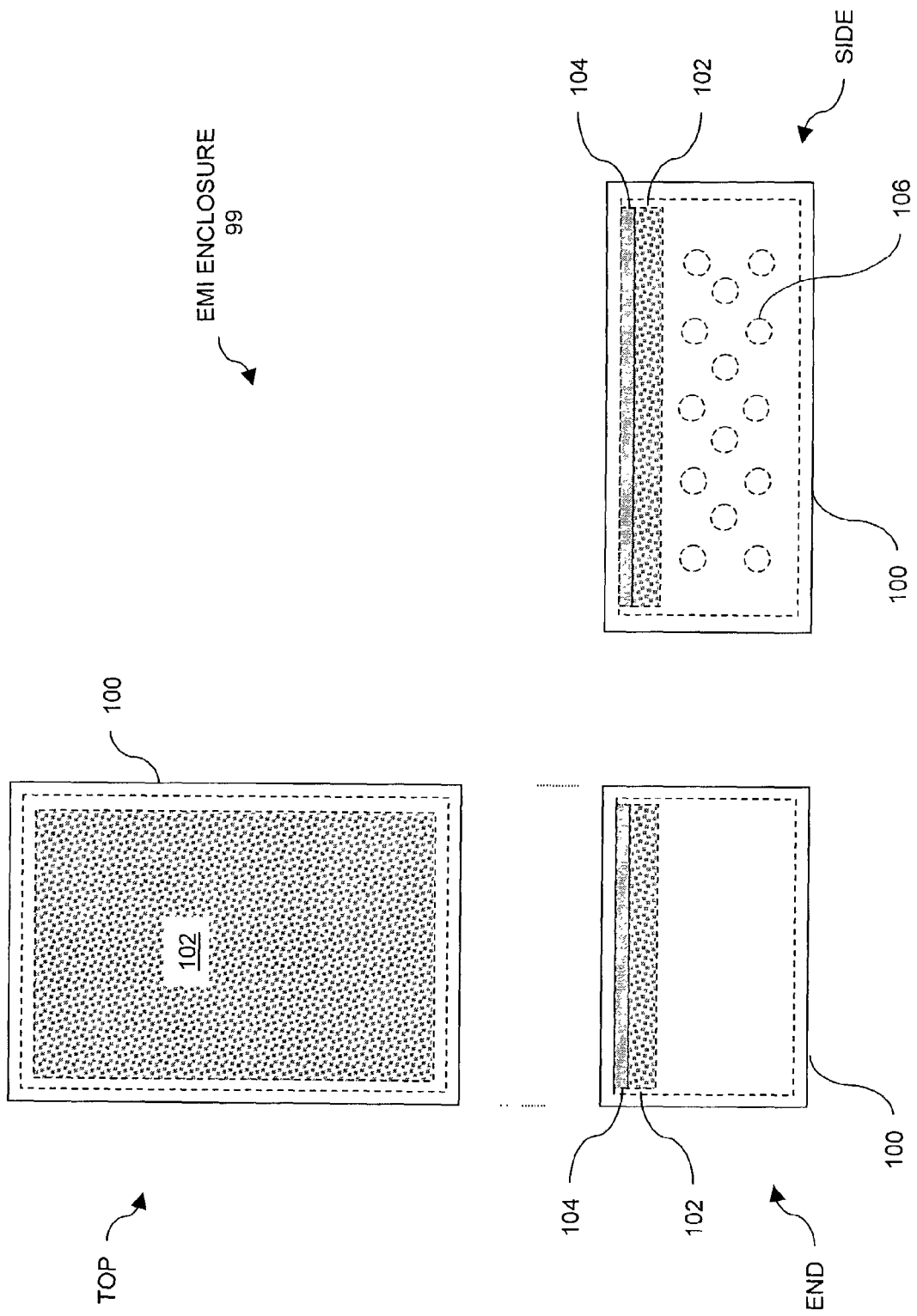
FIG. 2A is a schematic drawing of one embodiment of the invention, in which a lossy material is applied to an inside of a portion of an EMI enclosure.

FIG. 2A shows one embodiment of an EMI shield configured as an EMI enclosure 99 including an absorbing material 102 applied to a reflecting material 100. In this embodiment, the absorbing, or lossy, material 102 is applied to at least a portion of the reflecting material 100 using an adhesive 104. The adhesive can be a curable adhesive, such as an epoxy, or a non-curable adhesive, such as a pressure sensitive adhesive. The adhesive can be a conductive adhesive or a non-conducting adhesive.

The EMI enclosure 99 can include a highly-conductive reflecting material 100, such as aluminum, copper, nickel, tin, silver, gold, beryllium, steel, stainless steel, sheet metal, including compounds or combinations of different conducting materials, such as nickel plated copper, phosphor bronze, tin plated steel, etc. The EMI enclosure 99 can also include an insulative material, such as a plastic suitably coated with an electrically conducting, or metallic layer—such metal-coated plastic applications are common in the packaging of small, light-weight electronic devices.

The EMI enclosure 99 can be a substantially closed container, such as a box, or a partially-open container, such as a box or a cage having fewer than six sides. For example, the EMI enclosure 99 may include only five sides for applications in which the EMI enclosure 99 is installed onto another surface, such as a circuit board, substrate, or conductive enclosure. In some applications, the EMI enclosure 99 can be a plane, such as a plate adapted for fastening to an electronic device. The EMI enclosure 99 can also include one or more apertures 106. The apertures, for example, can be useful for providing interconnections to any electronic components and/or devices disposed therein. Additionally, apertures can be useful for cooling, or even for cost and/or weight savings for those applications in which a closed surface is unnecessary.

The lossy material 102 can be selectively applied to the entire internal and/or external surfaces of the EMI enclosure 99. Alternatively, the lossy material 102 can be selectively applied to a portion of the internal and/or external surfaces. For example, in applications in which the electromagnetic energy has a preferred polarization, or in applications in which only a portion of the EMI enclosure 99 is exposed to the EMI energy, the lossy material 102 can be applied in a limited manner, covering the most-vulnerable (i.e., exposed) surface or surfaces.

The lossy material 102 can be applied during the manufacturing process, or the lossy material 102 may be applied post-manufacturing. Use of the non-conductive, pressure-sensitive adhesive 104 facilitates application of the lossy material 102 after the manufacturing process. For example, the lossy material 102 may be applied during board-level assembly, either before or after any application of conformal coating, during the system level assembly, or at any time post-installation. In this manner, the lossy material may be applied to any EMI enclosure, at any time. For example, interference due to EMI often first occurs, or is first evident, during, or shortly after, equipment installation or upgrade. It is typically during this time that the electromagnetic environment often changes in unpredictable ways; therefore, it is beneficial to mitigate EMI during a post-installation scenario, by particularly tailoring the application of the lossy material as necessary.

Figure 2B:
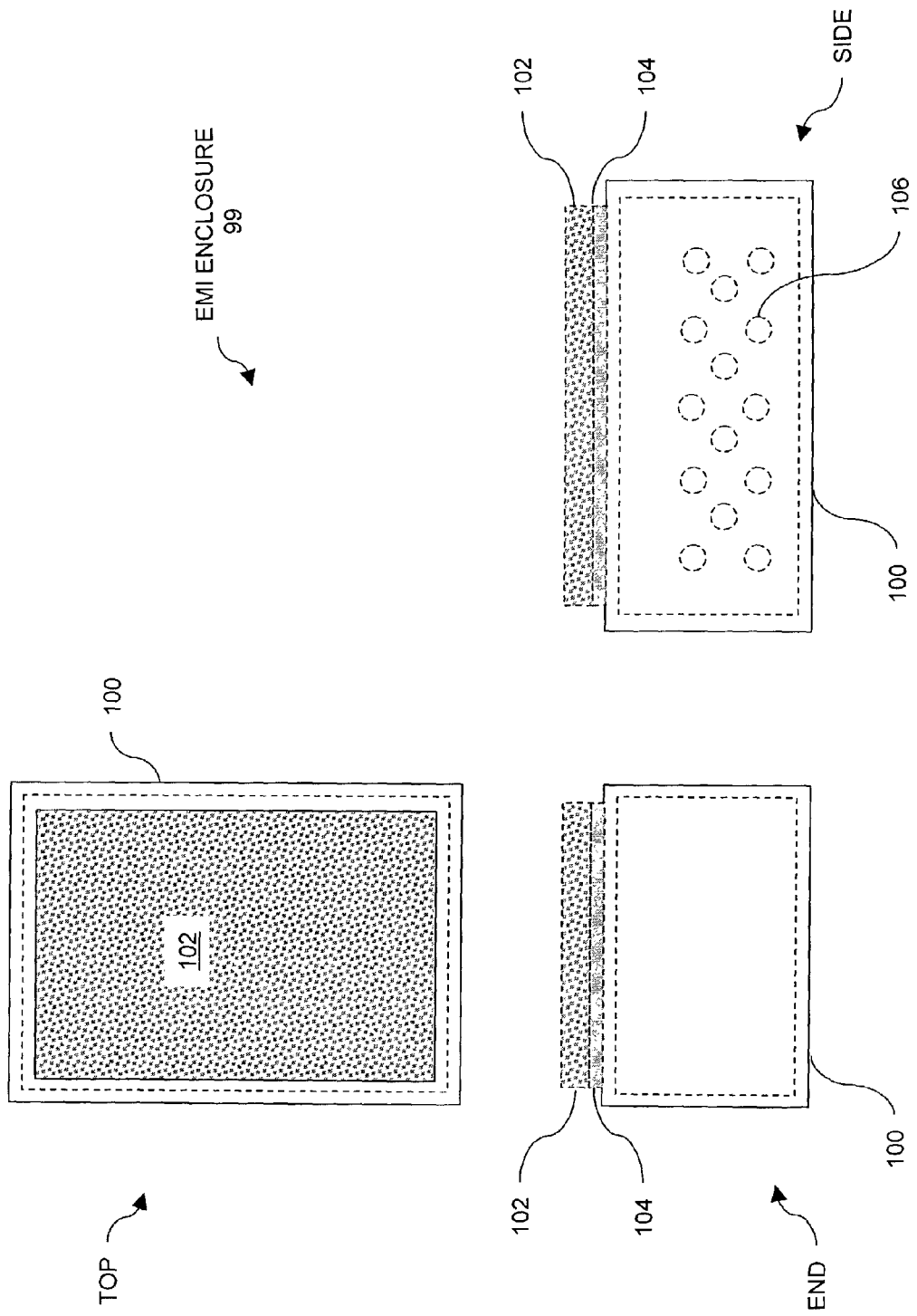
FIG. 2B is a schematic drawing of an alternative embodiment of the invention, in which a lossy material is applied to an outside of a portion of an EMI enclosure.

Referring to FIG. 2B, another embodiment of the EMI enclosure 99 is shown in which the lossy material 102 is applied to the exterior surface of the EMI enclosure 99 using adhesive 104. An external application attenuates any impinging EMI from other external systems and devices. Additionally, an external application of the lossy material 102 attenuates surface currents residing on the enclosure 99, as well as any proximate near fields.

Figure 2C:
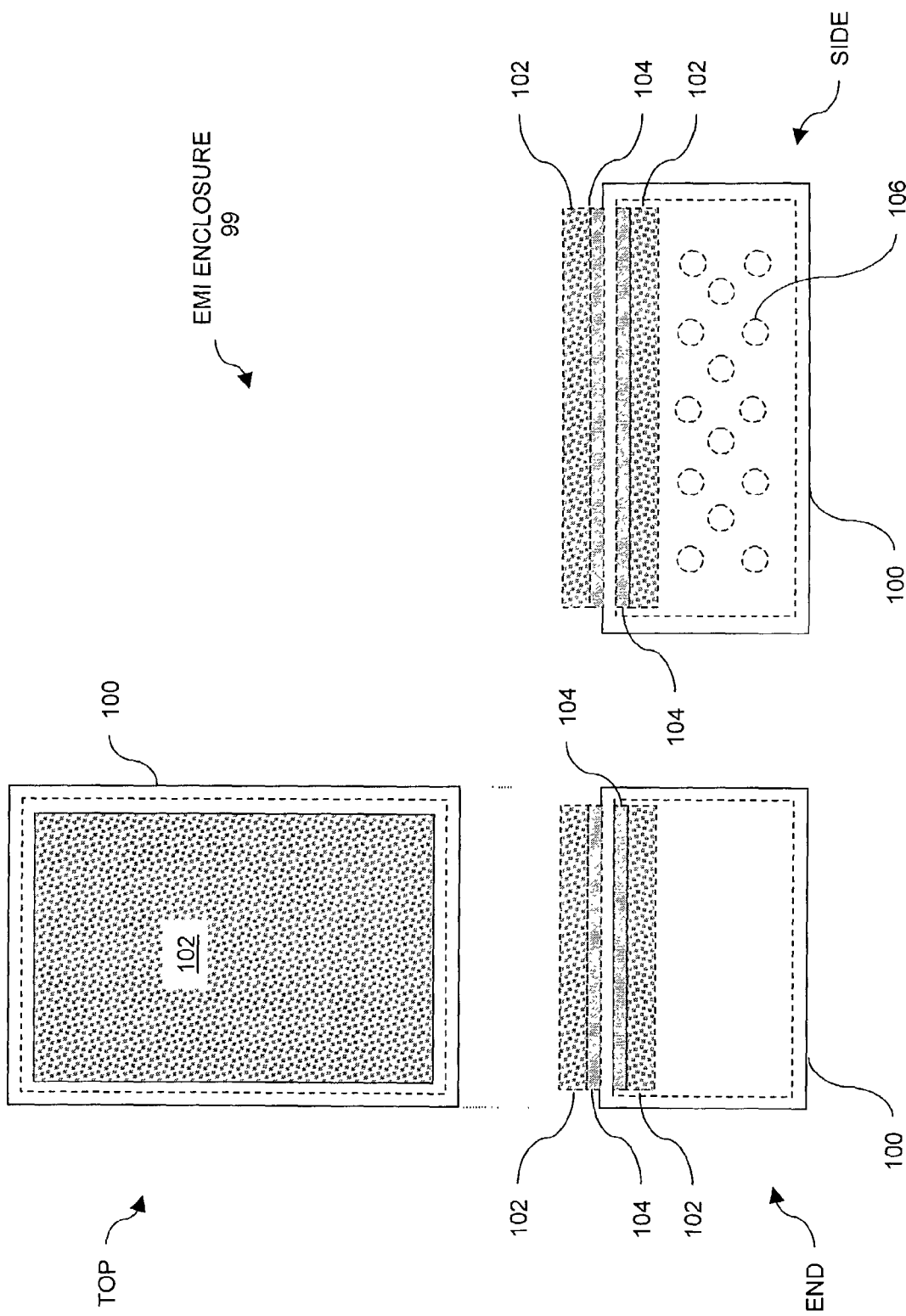
FIG. 2C is a schematic drawing of another alternative embodiment of the invention, in which a lossy material is applied to both the inside and the outside of a portion of an EMI enclosure.

FIG. 2C shows the EMI enclosure 99 having the lossy material 102 applied using the adhesive 104 to both the interior and the exterior surfaces of the conducting housing 100 to attenuate the EMI on both sides of the EMI enclosure 99.

Figure 1B:
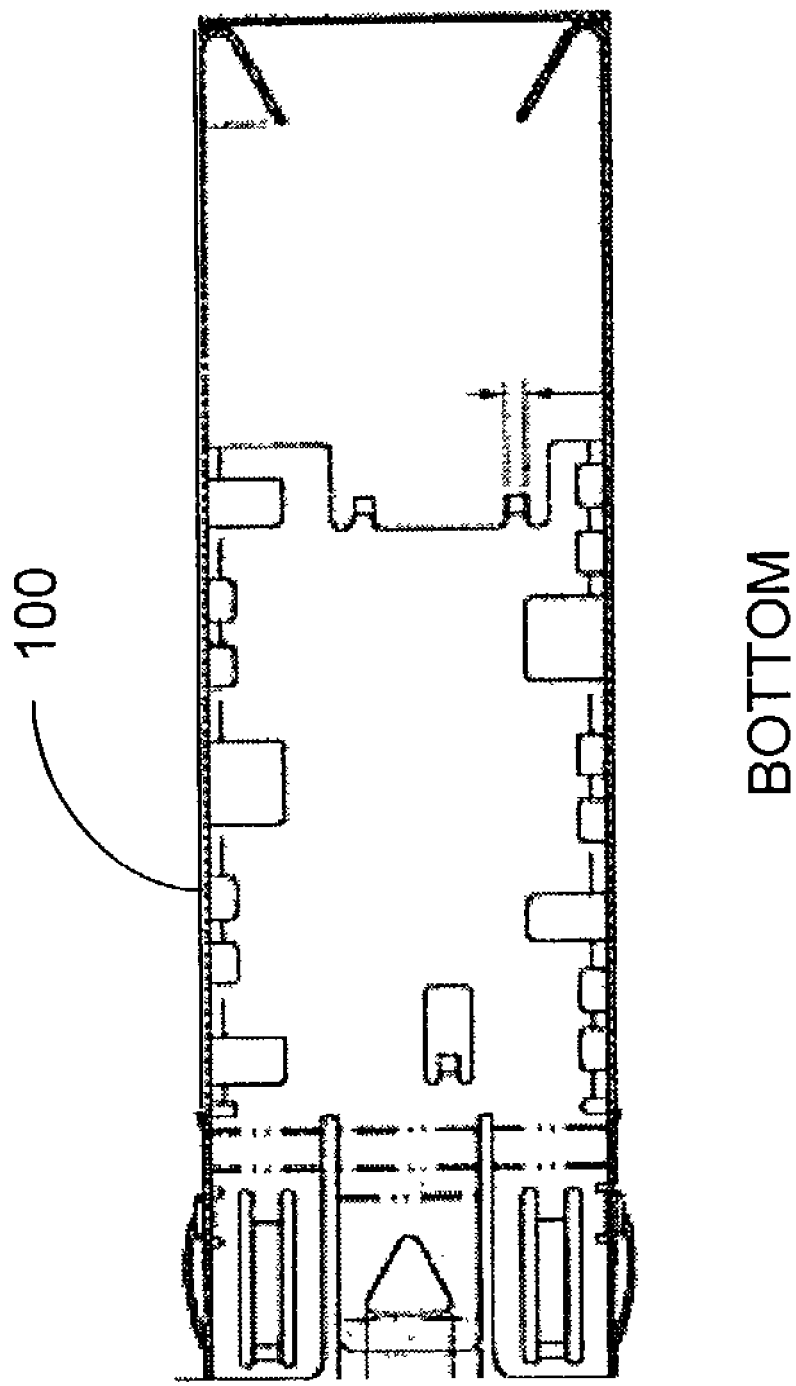
FIG. 1B is a schematic drawing depicting an external view of a bottom of the electrically-conducting EMI cage of FIG. 1A.
Figure 3:
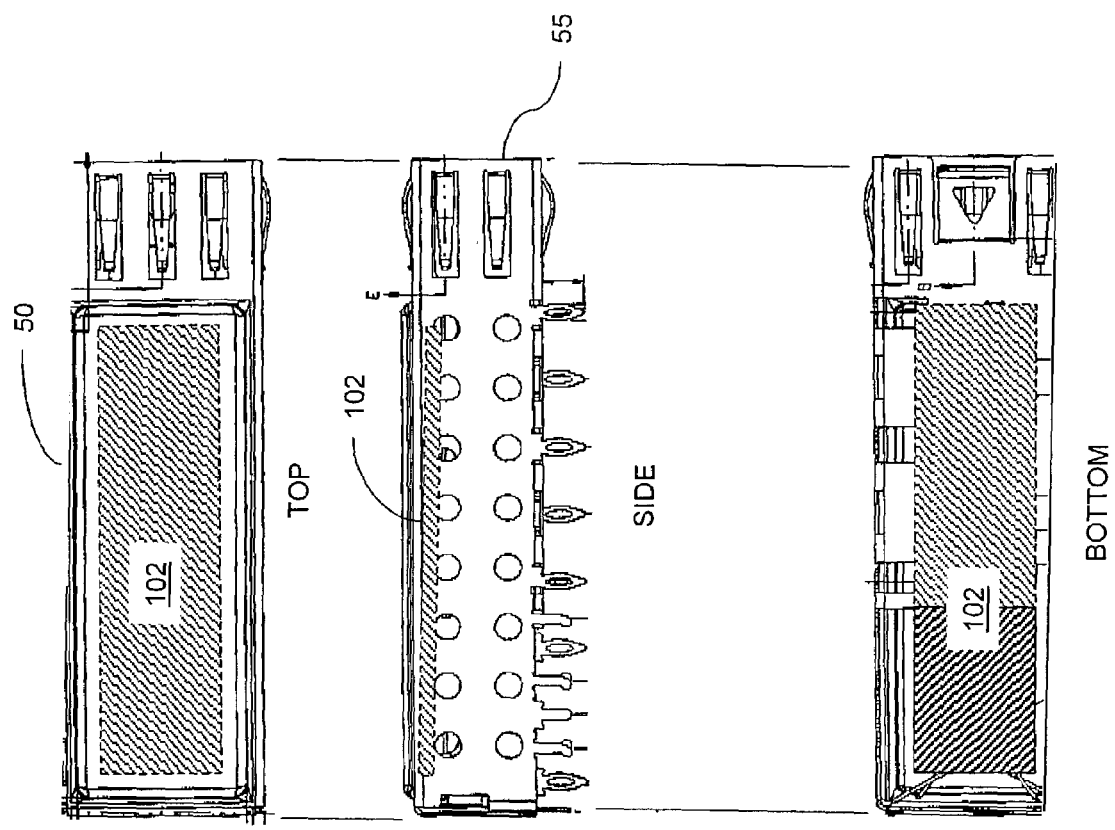
FIG. 3 is a more detailed drawing depicting the embodiment of the invention shown in FIG. 2A.

FIG. 3 shows in orthogonal projection, the exterior top, side, and bottom of an embodiment in which an absorbing material 102 is applied to the EMI cage 50 of FIGS. 1A and 1B. The absorbing material 102 is prepared in a rectangular sheet sized to fit along the interior top surface of the EMI cage 50. In one embodiment, the sheet of EMI material 102 is formed having a thickness of about 0.03 inch. The absorbing sheet 102 can be secured to the interior top surface using an adhesive. In another embodiment, the absorbing sheet 102 can be removably secured to the interior top surface of the EMI cage 105 relying on mechanical pressure provided by a suitably-sized component when inserted therein.

FIG. 4A shows a cross-section view of an EMI enclosure 99 with an external lossy material layer 200 applied to the external surface of the conductive material 100. In this application, the lossy material 200 is applied without the use of an adhesive. Alternative processes of applying the lossy material 200 to the conductive material 100 include any of a variety of coating processes, such as painting, dipping, spraying, inking, silk-screening, and other processes known to those skilled in the art.

FIG. 4B shows a cross-section view of the EMI enclosure 99 with an internal lossy material layer 202 similarly applied to the internal surfaces of the conducting material 100. FIG. 4C shows a cross-section view of the EMI enclosure 99 having both an external lossy material layer 200 and an internal lossy material layer 202 respectively applied to both the exterior and interior surfaces of the enclosure 99.

Figure 5:
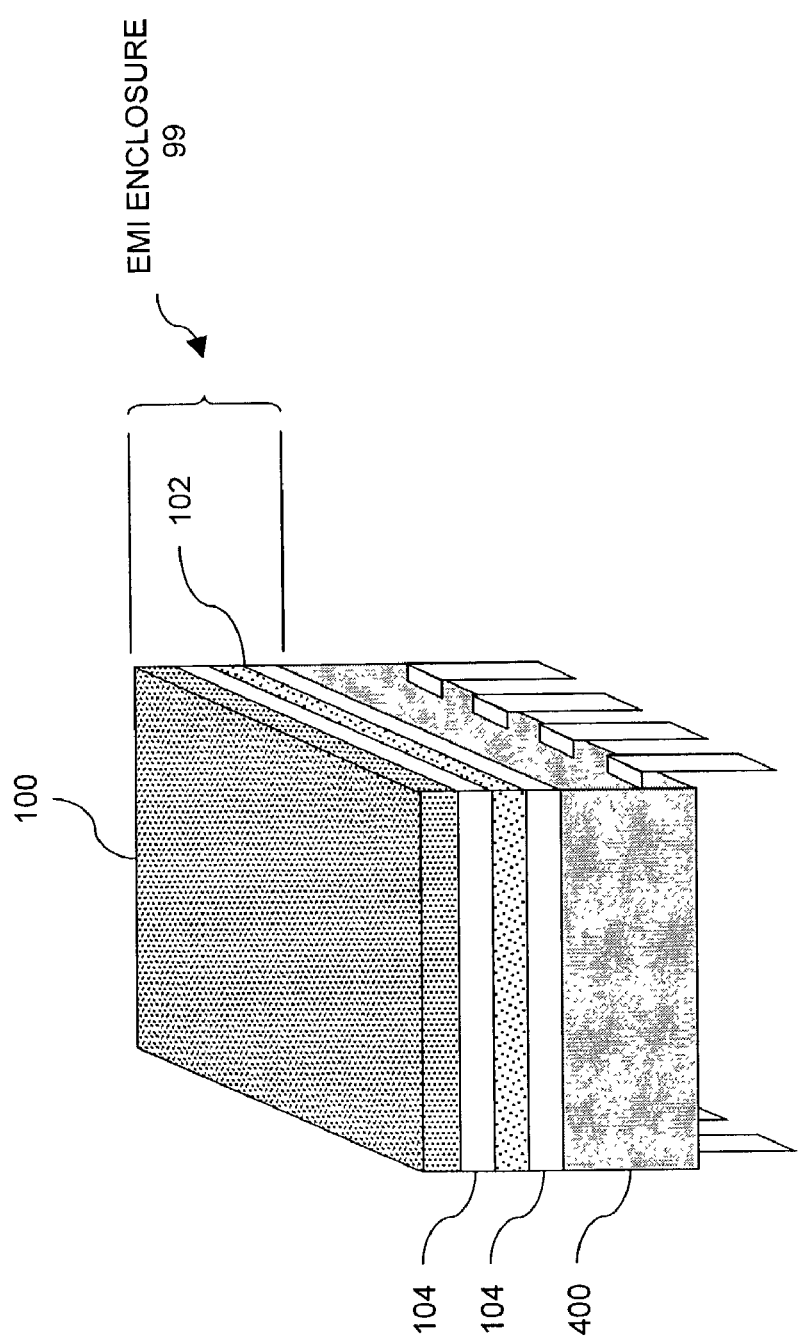
FIG. 5 is a schematic drawing of an embodiment of the invention, in which a lossy material is applied directly to an electronic component.

FIG. 5 shows another embodiment in which an EMI enclosure 99 is directly applied to an electronic component or device 400. For example, the EMI enclosure 99 can be selectively applied to at least one surface of an integrated circuit or device case. In one embodiment, the EMI enclosure 99 forms an EMI shield including a highly-conductive layer 100, an optional adhesive layer 104, a lossy material layer 102, and a second adhesive layer 104. In other embodiments, the EMI enclosure 99 can be fastened to the device 400 without the adhesive layer 104, using an alternative fastening means, such as a screw, a clip, or a frictional clamp.

Figure 6:
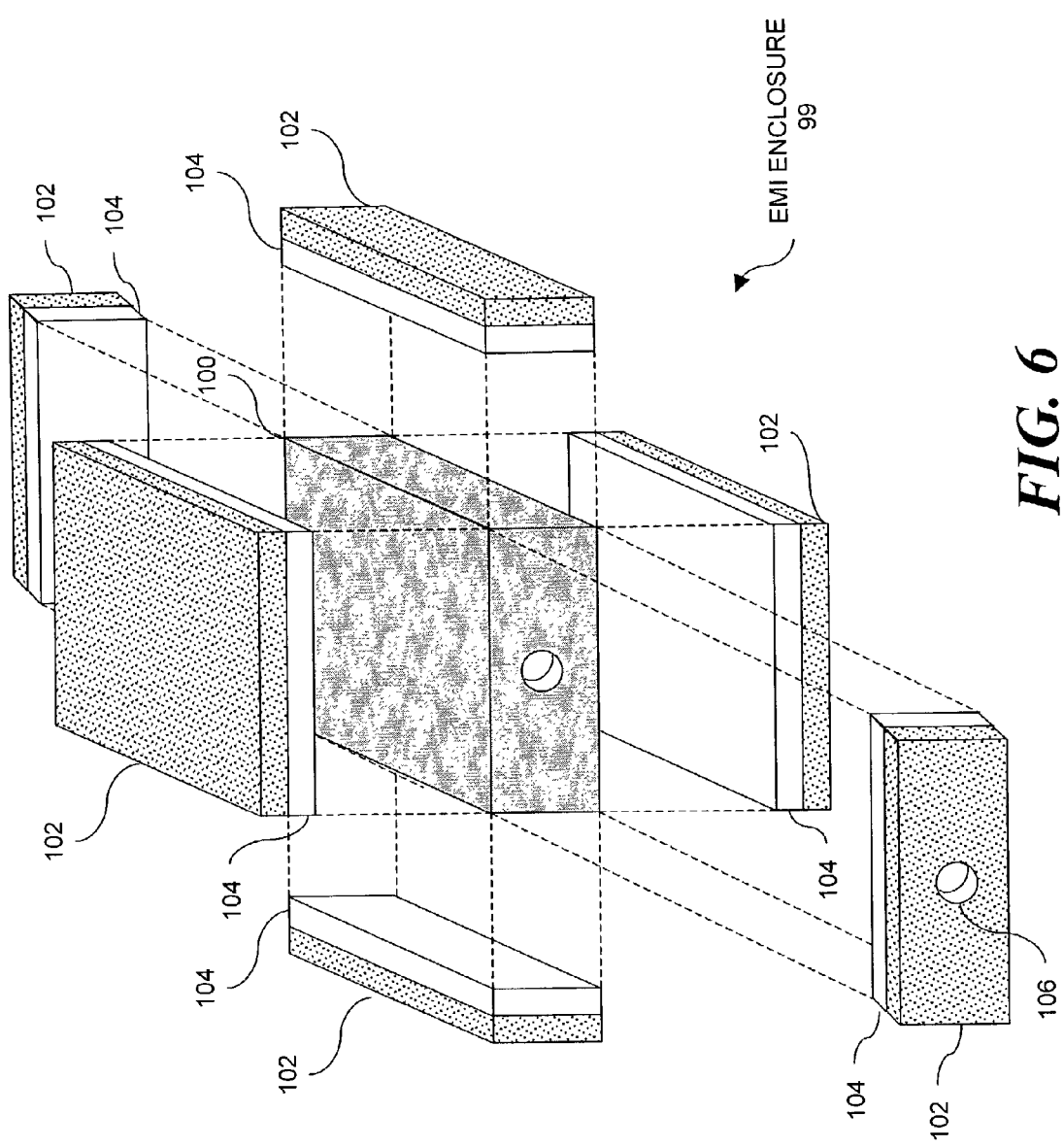
FIG. 6 is a schematic drawing depicting one embodiment of the invention, in which a lossy material is applied to a first side of an EMI enclosure.

FIG. 6 shows an exploded view of one embodiment of an EMI enclosure 99 in which substantially the entire exterior surface of an EMI shield 105 is protected with a layer of the lossy material 102. The lossy material 102 is applied as earlier described with an adhesive 104 and apertures are provided in the lossy material 102 to accommodate intentional apertures of the EMI shield 105. This technique may be used to coat any or all of the external surfaces of the EMI shield 105. The lossy material 102 can be pre-cut, or preformed according to predetermined dimensions before being applied to the EMI shield. Alternatively, the lossy material 102 can be fabricated in a compliant embodiment, such that the lossy material 102 can be formed (e.g., folded) about at least a portion of the EMI enclosure. Examples of compliant embodiments include flexible absorbing materials, such as a rubberized absorber (e.g., a polymer, or rubber matrix including absorbing particles). Again, apertures 106 can be provided, as required, to accommodate interconnects, cooling air flow, etc.

The addition of a lossy material layer 102 onto the EMI enclosure 99 is particularly effective for improving shielding effectiveness at frequencies above 1 GHz. For example, application of a lossy material layer 102 consisting of a silicone elastomer loaded with carbonyl-iron powder (CIP) to the top of the EMI enclosure shown in FIG. 3 provides an improved shielding effectiveness compared to the prior art device 50 shown in FIG. 1. In particular, addition of the lossy material layer 102 improves shielding effectiveness at frequencies found to be problematic in the prior art device 50 shown in FIG. 1. In one embodiment, the lossy material 102 can be formed into a sheet having, for example, a thickness of approximately 0.02 inches. The sheet of lossy material 102 can then be die-cut to shape and applied to a top inside surface of a shielded cage, such as the prior art device 50, using a non-conductive, pressure-sensitive adhesive 104. Depending on the particular application, the operating conditions, the lossy material 102, and how and where it is applied, it is contemplated that an improvement in shielding effectiveness of about 10 dB or more is achievable.

Figure 7:
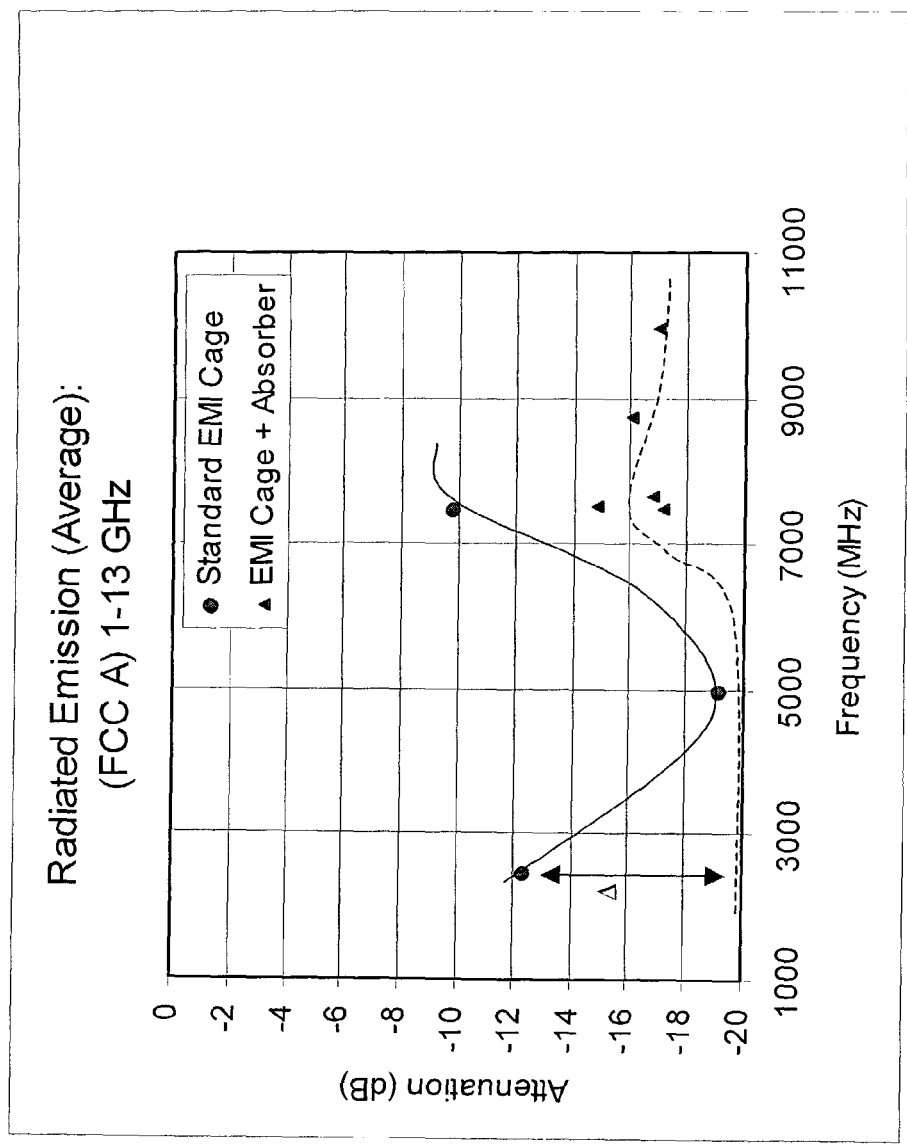
FIG. 7 is a graph representing test results comparing the radiated emissions performance of one embodiment of the invention to a prior art shield.

Referring now to FIG. 7, test results are provided graphically comparing radiated emissions performance of an EMI enclosure similar to the device 50 illustrated in FIG. 1, to radiated emissions performance of the same EMI enclosure having an absorber, or lossy material. Specifically, the absorber 102 tested was fabricated as a 0.02 inch thick, silicone elastomer loaded with carbonyl iron powder. The loaded elastomer was die-cut and applied to the interior top of the EMI enclosure. The vertical axis of the graph represents the attenuation, or loss (measured in decibels "dB") provided by each enclosure and the horizontal axis represents a corresponding frequency (measured in megahertz "MHz"). The results indicate that the shield treated with absorber offers greater attenuation than the untreated shield for all frequencies measured. For example, at approximately 2,000 MHz, the absorber-treated shield provides an improvement, or difference in attenuation (i.e., "A"), of at least about 8 dB.

Figure 8:
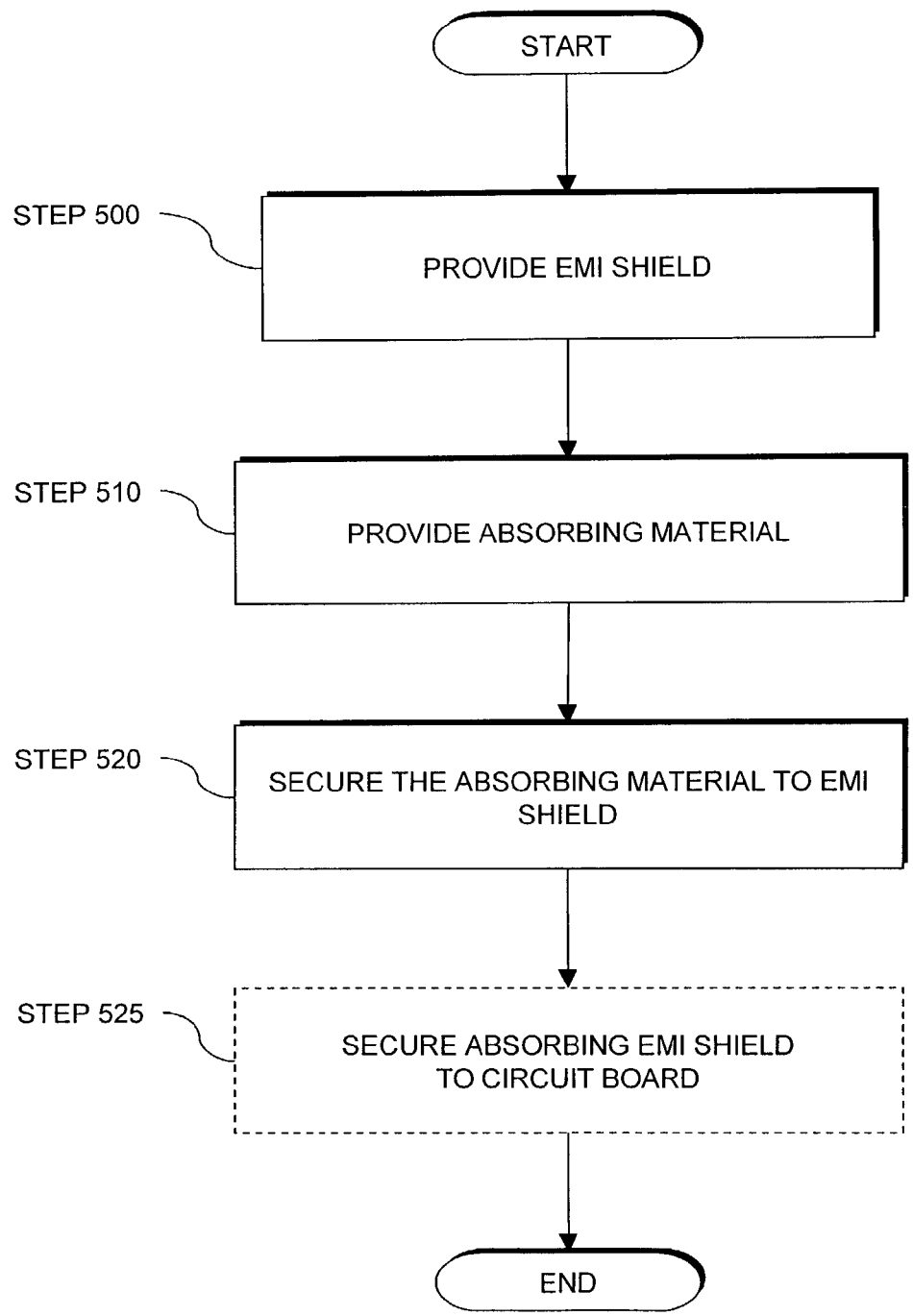
FIG. 8 is a flow diagram depicting the steps of the embodiment of the invention shown in FIG. 2A.

Referring to FIG. 8, a process for shielding electronic components includes the step of providing an EMI shield, such as a highly-conductive EMI material (step 500). Generally, the highly-conductive material, or EMI shield, is formed to enclose one or more electronic components. The EMI shield operates to reflect radiated electromagnetic energy, tending to maintain on one side of the shield electromagnetic energy originating on that side of the shield. Where there are apertures in the shield, however, some EMI will penetrate to the other side. The EMI shield also operates to collect conducted EMI and direct it to an electrical ground. (For example, the EMI shield may be electrically grounded through surface-mount soldering to a substrate, such as a printed-circuit board. The EMI shield may also be grounded through one or more grounding leads or bonding straps, or through one or more mounting pins designed to interconnect to electrical ground. The EMI shield contains within its enclosed cavity a portion of the EMI generated by the contained electronic components, while simultaneously protecting the contained components from susceptibilities of external electromagnetic energy.

Next, an absorbing material is provided (step 510). The absorbing or lossy material converts the EMI energy into another form of energy, such as thermal energy, thus removing that converted portion of the EMI from the environment. The absorbing material may be applied to the interior surface, the exterior surface, or to both surfaces, either partially or wholly. For applications in which the lossy material is applied to the interior portions of an EMI shield forming a cavity, in addition to absorbing a portion of the EMI, the lossy material alters the quality factor of the resonance formed by the cavity. For those applications in which the lossy material operates over a broad range of frequencies, the broad-band features of the lossy material operate to remove resonances over the broad frequency range. Finally, second EMI material (i.e., the lossy material) is bonded, secured, or otherwise applied to the first EMI material (i.e., the EMI shield) (step 520).

In some embodiments, the process optionally includes an additional step (shown in phantom) of securing the absorbing EMI shield to a substrate, such as a circuit board (step 525). Accordingly, in some applications, it is advantageous to provide EMI protection at the device, or even the component level. Such targeted shielding can result in cost savings, reduced complexity, and even improved performance. Product shields adapted for housing an electronic device mounted on a circuit board ("board level shield"), such as a printed circuit board, are commercially available. One supplier of board-level EMI shields is BMI, Inc. of Schaumburg, Ill. Exemplary board-level electrically-conducting EMI shields include BMI part numbers BMI-S-101 through BMI-S-107, and BMI-S-201 through BMI-S-207.

Board-level EMI shields are electrically conducting and generally form a box having five sides, the bottom of side of the box being open. Thus, the open box can be placed on top of a board-mounted electronic device. FIG. 9A illustrates a top, front, and side view of one embodiment of a board level shield 600. The board-level shield 600 can optionally include one or more apertures 602 on a top conducting surface 604, as illustrated. Once again, the apertures 602 can accommodate interconnects to and from the shielded device, as well as allowing for cooling air flow. A conducting side surface 605a of the board-level shield 600 can also be adapted for mounting to a substrate. For example, the side 605a includes mounting pins 610, or mounting pads for surface mount applications, that can be used to secure the board-level shield 600 to a circuit board by soldering. In some embodiments, the pins 610 extend into and/or through the circuit board such that the mounting edge 615 of the side makes contact with the circuit board. Intimate contact of the sides of the shield 600 with the circuit board is generally desirable to reduce unwanted apertures through which EMI could propagate. An electromagnetic absorber 618 can then be applied to one or more of the conducting sides 604, 605a, 605b of the board-level shield 600, as previously described. As illustrated, the absorber 618 is configured as a sheet and mounted to the shield's inside top surface 604. In some embodiments, the absorber 618 can additionally or alternatively be mounted to the sides 605a, 605b, and/or to any of the external surfaces of the shield 600.

FIG. 9B illustrates one packaging embodiment of the board-level absorbing EMI shield 600. Several board level shields 600 can be packaged on a tape 620 that can be wound upon a reel. Such a tape and reel packaging embodiment is well adapted for automated devices used to populate printed circuit boards in high-volume, high-throughput applications. Although the illustrations are directed to printed circuit board applications, the invention is scalable and can be adapted for mounting to other surfaces, such as semiconductor substrates.

FIGS. 10A through 10D illustrate an alternative embodiment including a two-piece board-level absorbing EMI shield. As illustrated, an electrically conducting frame 700 is constructed similar to the previously-described one-piece board-level shield 600, except at least one of the surfaces is removable. For example, the frame 700 can include one or more apertures 705, such that one surface is substantially open, thereby allowing access to any components and/or devices housed therein. Optionally a support member 710 can be provided for structural support and/or to facilitate handling of the frame 700 by automated devices. A separate surface, such as a top or cover 740, can then be provided, whereby the top can be fastened to the frame 700. In some embodiments, the cover 740 can be removably fastened using a mechanical fastening means providing for example, a frictional fit, or a tension fit (e.g., spring fingers). In other embodiments, the cover 740 can be removably fastened using a chemical fastener, such as a conductive adhesive or a solder. Again, at least one side, such as the cover 740 can include an absorber 744 and, optionally, apertures 742 for interconnects and/or cooling. As illustrated in FIGS. 10C and 10D, two-piece EMI shields can also be packaged in tape and reel configurations to support high-volume mass production. In one embodiment illustrated in FIG. 10C, frames 700 are mounted on a first tape 750a. Similarly, as illustrated in FIG. 10D, covers 740 are mounted on a second tape 750b. In other embodiment, the combined frame 710 and cover 740 can be pre-assembled and packaged on a single tape.

Variations, modifications, and other implementations of what is described herein will occur to those of ordinary skill in the art without departing from the spirit and the scope of the invention as claimed. The various features and configurations shown and equivalents thereof can be used in various combinations and permutations. Accordingly, the invention is to be defined not by the preceding illustrative descriptions, but instead by the following claims.

What is claimed is:

1. An apparatus for providing shielding from high frequency, electromagnetic interference, the apparatus comprising:
   an electrically-conductive shield adapted for covering at least a portion of a device having an operating frequency of about 2.5 gigabits per second, or an operating frequency within a range of about 7.5 gigabits per second to about 10 gigabits per second, the electrically-conductive shield including an electrically-conductive frame and at least one removable cover that is removably attached to the electrically-conductive frame;
   an electromagnetic absorbing material disposed on at least a first side of the at least one removable cover of the electrically-conductive shield, the electromagnetic absorbing material comprising a matrix including a silicone elastomer and an electrically absorbing carbonyl iron powder, where the thickness of the material and amount of carbonyl iron powder are tailored for absorbing at least a portion of electromagnetic energy having a frequency within a predetermined range of about 2000 megahertz to about 3000 megahertz, or about 7500 megahertz to about 10000 megahertz associated with the device, the electromagnetic absorbing material providing an improvement in attenuation of electromagnetic energy with respect to the device by at least about 6 decibels;
   wherein the at least one removable cover with the electromagnetic absorbing material disposed thereon is removable to thereby allow access to a device disposed under the electrically-conductive shield for replacement or upgrade of the device.

2. The apparatus of claim 1, wherein the apparatus comprises an enclosure defining a cavity suitable for housing a device.

3. The apparatus of claim 2, wherein the enclosure is adapted for enclosing the device on substantially all sides.

4. The apparatus of claim 2, wherein the enclosure is adapted for covering a board-mounted device.

5. The apparatus of claim 4, wherein the enclosure is adapted for attachment to a circuit board.

6. The apparatus of claim 2, wherein the electromagnetic absorbing material is applied to at least a portion of an interior surface of the enclosure.

7. The apparatus of claim 1, wherein the electromagnetic absorbing material is tailored for absorbing at least a portion of electromagnetic energy having a base frequency up to about 10000 megahertz and harmonics thereof.

8. The apparatus of claim 1, wherein the electrically-conductive shield is adapted for housing at least one of a fiber optic transmitter and a fiber optic receiver.

9. The apparatus of claim 1, wherein the electrically-conductive shield is adapted for housing a gigabit interface converter (GBIC).

10. The apparatus of claim 1, wherein the electrically-conductive shield comprises a form factor substantially compliant with a small-form-factor-pluggable standard.

11. The apparatus of claim 1, wherein the electrically-conductive shield comprises one or more materials selected from the group consisting of aluminum, copper, nickel, tin, silver, gold, beryllium, phosphor bronze, steel, stainless steel, and combinations thereof.

12. The apparatus of claim 1, wherein the electrically-conductive shield comprises sheet metal.

13. The apparatus of claim 1, wherein the electromagnetic absorbing material comprises one or more materials selected from the group consisting of electrically conductive material, carbonyl iron powder, sendust, ferrite, iron silicide, magnetic alloys, magnetic flakes, and combinations thereof.

14. The apparatus of claim 1, wherein the electromagnetic absorbing material comprises electrically absorbing particles suspended in a matrix, wherein said matrix has a sufficient thickness and said electrically absorbing particles are configured within the matrix for absorbing at least a portion of electromagnetic energy having a frequency within a predetermined range of about 2000 megahertz to about 3000 megahertz, or about 7500 megahertz to about 10000 megahertz associated with the device, wherein said matrix comprises silicone elastomer, and wherein said electrically absorbing particles comprise carbonyl iron powder.

15. The apparatus of claim 1, wherein the electromagnetic absorbing material comprises one or more materials selected from the group consisting of electrically conductive material, carbon, carbonyl iron powder, sendust, ferrites, iron silicide, magnetic alloys, magnetic flakes, steel wool, carbon-impregnated rubber, ferrite in a plastic stranded carrier, metal foils, metal clad materials including iron, nickel, and iron/nickel compositions, paste composites selected from the group consisting of iron, nickel copper with epoxy, lacquer binders, and combinations thereof, and combinations thereof.

16. The apparatus of claim 1, wherein the electromagnetic absorbing material is attached to the electrically-conductive shield using an adhesive.

17. The apparatus of claim 1, wherein the electromagnetic absorbing material comprises at least one of a molded material and a formed in place material.

18. The apparatus of claim 17, wherein the electromagnetic absorbing material is attached using a curable adhesive, and wherein the electromagnetic absorbing material comprises the curable adhesive.

19. The apparatus of claim 1, wherein the electrically-conductive shield includes the electrically-conductive frame having at least one aperture that allows access for replacing or upgrading an electrical device disposed under the electrically-conductive shield, and the at least one cover is removably attachable to the frame over the at least one aperture, and wherein the electromagnetic absorbing material is applied on at least a portion of the cover and the thickness of the material and amount of carbonyl iron powder are tailored to provide shielding of electromagnetic energy having a frequency within a predetermined range of about 7500 megahertz to about 10000 megahertz associated with an upgraded device installed under the electrically-conductive shield.

20. The apparatus of claim 1, wherein the electrically-conductive shield comprises a box having at least one substantially open side to thereby allow the box to be positioned over a board-mounted device.

21. The apparatus of claim 1, further comprising a flame retardant suspended in a matrix with the electromagnetic absorbing material.

22. The apparatus of claim 1, wherein the electrically-conductive shield further comprises at least one removable portion for providing access to at least a portion of the device covered by the electrically-conductive shield.

23. The apparatus of claim 1, wherein the electromagnetic absorbing material absorbs at least a portion of electromagnetic energy having a frequency of about 2000 megahertz, the electromagnetic absorbing material providing an improvement in attenuation of electromagnetic energy with respect to the device by at least about 8 decibels.

24. The apparatus of claim 1, wherein the electromagnetic absorbing material absorbs at least a portion of electromagnetic energy having a frequency of at least about 7500 megahertz, the electromagnetic absorbing material providing an improvement in attenuation of electromagnetic energy with respect to the device by at least about 8 decibels.

25. A method for attenuating a transfer of high-frequency electromagnetic energy with respect to a device having operating frequencies within a range of about 2.5 gigabits per second to about 10 gigabits per second, the method comprising the steps of:
reflecting electromagnetic energy at an electrically-conductive shield covering at least a portion of a device, the electrically-conductive shield including an electrically-conductive frame having an aperture to allow access to a device, and at least one cover removably attached to the electrically-conductive frame to cover at least a portion of the device;
altering an electromagnetic resonance associated with the electrically-conductive shield; and
absorbing, with an electromagnetic absorbing material comprising a matrix including a silicone elastomer and an electrically absorbing carbonyl iron powder, a portion of electromagnetic energy proximate to the electrically-conductive shield, thereby reducing a transfer of electromagnetic energy with respect to the device;
wherein the electromagnetic absorbing material is disposed on at least a portion of the at least one removable cover of the electrically-conductive shields which is removable to allow access to the device disposed under the electrically-conductive shield for replacement or upgrade of the device, and the thickness of the material and amount of carbonyl iron powder are tailored such that the electromagnetic absorbing material absorbs at least a portion of electromagnetic energy having a frequency within a predetermined range of about 2000 megahertz to about 10000 megahertz associated with said device.

26. The method of claim 25, wherein the step of altering the electromagnetic resonance comprises reducing a peak amplitude of the electromagnetic resonance.

27. The method of claim 25, wherein the electromagnetic absorbing material is attached to the electrically-conductive shield using at least one of a curable adhesive and a non-curable adhesive.

28. The method of claim 25, wherein the electromagnetic absorbing material comprises at least one of a molded material and a formed in place material.

29. The method of claim 28, wherein the electromagnetic absorbing material is attached using a curable adhesive, and wherein the electromagnetic absorbing material comprises the curable adhesive.

30. The method of claim 25, wherein the electrically-conductive shield further comprises at least one removable portion for providing access to at least a portion of the device covered by the electrically-conductive shield, and wherein the method includes removing the at least one removable portion to access at least a portion of the device covered by the electrically-conductive shield.

31. The method of claim 25, wherein the electromagnetic absorbing material absorbs at least a portion of electromagnetic energy having a frequency within a predetermined range of about 2000 megahertz to about 3000 megahertz associated with a device, the electromagnetic absorbing material providing an improvement in attenuation of electromagnetic energy with respect to the device by at least about 6 decibels.

32. The method of claim 25, wherein the electromagnetic absorbing material absorbs at least a portion of electromagnetic energy having a frequency within a predetermined range of about 7500 megahertz to about 10000 megahertz associated with a device, the electromagnetic absorbing material providing an improvement in attenuation of electromagnetic energy with respect to the device by at least about 6 decibels.

33. The method of claim 25, wherein the electromagnetic absorbing material absorbs at least a portion of electromagnetic energy having a base frequency up to about 10000 megahertz and harmonics thereof.

34. A method for attenuating a transfer of high-frequency electromagnetic energy with respect to a fiber optic transmitting device having operating frequencies within a range of about 2.5 gigabits per second to about 10 gigabits per second, the method comprising the steps of:
providing an electrically-conductive shield adapted for covering at least a portion of a device, the electrically-conductive shield including an electrically-conductive frame having an aperture to allow access to the device, and a cover removably fastened to the electrically-conductive frame to allow access to the device for replacement or upgrade of the device;
providing an electromagnetic absorbing material that comprises a matrix including a silicone elastomer and an electrically absorbing carbonyl iron powder, where the material thickness and amount of carbonyl iron powder is adapted for absorbing at least a portion of electromagnetic energy having a frequency within a predetermined range of about 2000 megahertz to about 10000 megahertz associated with the device;
treating substantially all of the electrically-conductive shield with the electromagnetic absorbing material; and placing the treated electrically-conductive shield proximate to the device, where the treated electrically-conductive shield reduces a transfer of electromagnetic energy with respect to the device by absorbing at least a portion of electromagnetic energy having a frequency within a predetermined range of about 2000 megahertz to about 10000 megahertz associated with the device.

35. The method of claim 34, wherein treating comprises applying the electromagnetic absorbing material to a first side of the electrically-conductive shield.

36. The method of claim 34, wherein treating is selected from the group including painting, dipping, spraying, vapor depositing, silk screening, mechanically fastening, chemically bonding, and combinations thereof.

37. The method of claim 34, wherein treating comprises at least one of molding, forming, and forming in place the electromagnetic absorbing material onto the electrically-conductive shield.

38. The method of claim 37, wherein the electromagnetic absorbing material is attached to the electrically-conductive shield using a curable adhesive, and wherein at least one of the molded electromagnetic absorbing material and the formed in place electromagnetic absorbing material comprises the curable adhesive.

39. The method of claim 34, wherein the step of providing an electromagnetic absorbing material comprises forming a sheet of absorbing material and the step of adapting the electromagnetic absorbing material comprises applying a chemical fastener to at least one side of the sheet of absorbing material.

40. The method of claim 34, wherein the electromagnetic absorbing material is attached to the electrically-conductive shield using at least one of a curable adhesive and a non-curable adhesive.

41. The method of claim 34, wherein the electromagnetic absorbing material is adapted for absorbing at least a portion of electromagnetic energy having a base frequency up to about 10000 megahertz and harmonics thereof.

42. An apparatus for attenuating a transfer of high-frequency electromagnetic energy with respect to a device having an operating frequency of about 2.5 gigabits per second, or an operating frequency within a range of about 7.5 gigabits per second to about 10 gigabits per second, the apparatus comprising:
means for reflecting electromagnetic energy, said means being adapted for covering at least a portion of the device in a removable manner, to allow access to the device for replacement or upgrade of the device;
means for altering an electromagnetic resonance response associated with the reflecting means; and
means for absorbing a portion of electromagnetic energy having a frequency within a predetermined range of about 2000 megahertz to about 3000 megahertz, or about 7500 megahertz to about 10000 megahertz, associated with said device, the absorbing means comprising a matrix including a silicone elastomer and an electrically absorbing carbonyl iron powder, where the amount of carbonyl iron powder and thickness of the absorbing means disposed on at least a first side of the reflecting means are tailored for absorbing at least a portion of electromagnetic energy having a frequency within a range of about 2000 megahertz to about 3000 megahertz, or about 7500 megahertz to about 10000 megahertz, thereby reducing a transfer of electromagnetic energy with respect to the device by at least about 6 decibels.

43. The apparatus of claim 42, wherein the reflecting means comprises an electrically-conductive shield having at least one removably attachable portion.

44. The apparatus of claim 42, wherein the altering means comprises an electromagnetic absorbing material.

45. The apparatus of claim 42, wherein the absorbing means is attached to the reflective means using at least one of a curable adhesive and a non-curable adhesive.

46. The apparatus of claim 45, wherein the non-curable adhesive comprises a pressure sensitive adhesive.

47. The apparatus of claim 42, wherein the absorbing means comprises at least one of a molded material and a formed in place material.

48. The apparatus of claim 47, wherein the absorbing means is attached to the reflective means using adhesive means, and wherein the absorbing means comprises the adhesive means.

49. The apparatus of claim 42, wherein the amount of carbonyl iron powder and thickness of the absorbing means are tailored for absorbing at least a portion of electromagnetic energy having a base frequency up to about 10000 megahertz and harmonics thereof.

* * * * *